United States Patent [19]

Haigler

[11] Patent Number: 4,887,298

[45] Date of Patent: Dec. 12, 1989

[54] ELECTRONIC CIRCUIT FOR SENSING DISCONNECT OR FAILURE OF A POWER OUTPUT SENSE LINE IN AN AUDIO POWER SYSTEM

[75] Inventor: Robert M. Haigler, Laguna Beach, Calif.

[73] Assignee: Renkus-Heinz, Irvine, Calif.

[21] Appl. No.: 207,064

[22] Filed: Jun. 15, 1988

[51] Int. Cl.[4] ............................................ H03G 11/00
[52] U.S. Cl. ....................................... 381/55; 381/59; 381/96; 330/298; 330/207 P
[58] Field of Search .............. 330/298, 207 P; 381/55, 381/59, 96

[56] References Cited

U.S. PATENT DOCUMENTS

| | | |
|---|---|---|
| 3,449,518 | 6/1969 | Erath . |
| 3,497,621 | 2/1970 | Erath . |
| 3,678,202 | 7/1972 | Rose . |
| 3,989,908 | 11/1976 | Budrys et al. .......................... 381/59 |
| 4,227,048 | 10/1980 | Nagata .............................. 333/28 T |
| 4,327,250 | 4/1982 | Von Recklinghausen ........... 381/55 |
| 4,379,209 | 4/1983 | Sakano ............................. 330/207 P |
| 4,399,326 | 8/1983 | Bode . |
| 4,441,085 | 4/1984 | Sakamoto ........................ 330/207 P |
| 4,583,245 | 4/1986 | Gelow et al. ......................... 381/59 |
| 4,723,292 | 2/1988 | Taylor ................................... 381/55 |

Primary Examiner—Forester W. Isen
Attorney, Agent, or Firm—Knobbe, Martens Olson & Bear

[57] ABSTRACT

A detection circuit for detecting the failure or disconnection of a sense line in an audio processing system that provides an audio output signal that drives the input of an audio power amplifier. The audio power amplifier drives a speaker. The audio processing system includes an input for receiving a first feedback signal on a sense line from the output of the power amplifier. The audio processing system is responsive to the first feedback signal to control the amount of power provided to the input of the power amplifier and thus to the speaker. The detection circuit also receives the first feedback signal. The detection circuit further receives a second feedback signal from the output of the audio processing system prior to the input of the power amplifier. The magnitude of the second feedback signal is compared to the magnitude of the first feedback signal to determine whether the sense line is providing the first feedback signal from the output of the power amplifier. If the second feedback signal is present on the input to the detection circuit when the first feedback signal is not present on the input to the detection circuit from the sense line, the sense line may have failed or may have been disconnected. When this occurs, the detection circuit automatically activates a mute circuit to attenuate the output of the audio processing system so that the output of the power amplifier will not exceed the safe operating limits of the speaker.

10 Claims, 4 Drawing Sheets

4,887,298

ELECTRONIC CIRCUIT FOR SENSING DISCONNECT OR FAILURE OF A POWER OUTPUT SENSE LINE IN AN AUDIO POWER SYSTEM

BACKGROUND OF THE INVENTION

1. Field of Invention

The present invention relates to audio speakers and speaker systems, and in particular to an electronic circuit and method for insuring the proper operation of electronic circuits designed to protect audio speaker systems from overload.

2. Description of Related Prior Art

Electronic circuits and methods for protecting audio speaker systems from being overloaded by their input electrical signals, while maintaining substantially uniform speaker response are well-known in the art. One method by which such protection may be achieved is the use of an electronic circuit designed to protect speakers from thermal overload resulting from high frequency electrical signal current, and excessive excursion of the speaker membrane resulting from excessive low frequency electrical signal current. Circuits which prevent thermal damage to speakers by monitoring and limiting the level of input high frequency electrical signal current thereto are well-known in the art. Similarly, circuits which prevent physical damage to speakers caused by excessive excursion of their cones or diaphragms are also well-known in the art. An example of the latter and a detailed description thereof may be found in U.S. Pat. No. 4,583,245 by Gelow, et al. Such protection circuits are often referred to as audio processing systems or audio processors.

Regardless of the circuit or method used to provide such protection to a speaker, one characteristic is common to all. That is, a closed-loop system must be used. In other words, the protection circuit must monitor the actual audio signal which drives the speaker intended to be protected. This requires a feedback, or "sense," line electrically connecting the input line of the speaker and the protection circuit. Without this connection, the protection circuit cannot monitor the signal driving the speaker, leaving the speaker unprotected from potential thermal overload or physical damage.

Under normal use or operation, the requisite connection between the input of the speaker and the protection circuit is provided during the installation and setup of the audio system. However, frequently this connection will not be made due to forgetfulness or ignorance on the part of the installer, or it may fail due to some form of electrical or mechanical failure. Should this happen, the utility of the protection circuit is impaired or defeated entirely. Thus, in order to provide complete protection, the protection circuit must not only provide full protection when fully and properly connected, but it must also provide some level of protection when not fully or properly connected. Furthermore, such a fully protective circuit should provide some means of informing its installer or operator of its improper connection.

SUMMARY OF THE INVENTION

The present invention comprises a detection circuit and a method for making a speaker protection circuit fully protective, even when the monitoring, or "sense" line at the input to the speaker is disconnected. The detection circuit further provides visual and aural indication that the sense line is not connected.

The detection circuit monitors the audio signal at the output of the speaker protection circuit and compares it to the audio signal present on the sense line which is connected to the input of the speaker to be protected. If a signal is present at the output of the speaker protection circuit, the detection circuit of the present invention checks to ensure that there is also a signal present on the sense line. If no signal is detected on the sense line, the detection circuit causes the protection circuit to turn off or greatly reduce the level of the signal transmitted to the speaker. The detection circuit then waits for a predetermined period of time before causing the protection circuit to once again transmit the signal to the speaker. Once transmission of the signal is resumed, the detection circuit again checks the sense line to see if a signal is present, and again, if no signal is detected at the sense line, signal transmission to the speaker ceases.

During this period that no signal is detected on the sense line, a light-emitting diode is lit by the detection circuit to inform the operator that a failure on the sense line has been detected. Further, this sequence of enabling and disabling signal transmission to the speaker is repeated at such a rate that the resulting fluctuation in volume of sound emanating from the speaker gives an aural indication that a failure on the sense line has been detected.

One aspect of the present invention is a protection circuit for an audio power system which includes an audio processor circuit that provides an audio output signal to an audio power amplifier. In such a system, the audio power amplifier provides an amplified audio output signal to a speaker. The audio processor circuit includes a sense input for receiving a sense input signal proportional to the magnitude of the amplified audio output signal from the audio power amplifier. The processor circuit is responsive to the magnitude of the sense signal to selectively reduce the magnitude of the audio output signal. The protection circuit of the present invention comprises a first input for receiving the sense input signal, and a second input for receiving a signal proportional to the audio output signal from the processor circuit. The protection circuit further includes means for comparing the sense input signal with the audio output signal and for generating a control signal when the sense input signal fails to change when the audio output signal changes. The protection circuit further includes a mute circuit connected to the output of the processor circuit. The mute circuit is responsive to the control signal to attenuate the audio output signal when the sense signal fails to change when the audio output signal changes.

Another aspect of the invention is a sense line failure detection circuit for a speaker system protection circuit which accepts an audio input signal and provides an audio output signal to an audio power amplifier. The audio power amplifier provides an amplified audio output signal to a speaker. The speaker system protection circuit has a sense input from a sense line for receiving a sense input signal proportional to the magnitude of the amplified audio output signal from the audio power amplifier. The speaker system protection circuit responds to the magnitude of the sense signal to selectively attenuate the audio output signal. The sense line failure detection circuit comprises a first input for receiving the sense input signal from the sense line, and a second input for receiving a feedback signal proportional to the audio output signal from the speaker system protection circuit. The sense line failure detection circuit further includes a comparison circuit which compares the relative magnitudes of the sense input signal and the feedback signal. The comparison circuit generates a mute control signal when the sense input signal is not present and the feedback signal is present. The sense line failure detection circuit further includes a mute circuit connected to the output of the speaker system protection circuit. The mute circuit is responsive to the mute control signal to attenuate the audio output signal when the sense input signal is not present and the feedback signal is present.

In preferred embodiments, the sense line failure detection circuit further comprises a buffer circuit connected to the first input of the detection circuit. The buffer circuit provides a buffered sense signal to the speaker system protection circuit. The buffered sense signal is proportional to the sense input signal. The buffer circuit further provides a sense sample signal to the comparison circuit to be compared with the magnitude of the feedback signal.

The comparison circuit preferably comprises a first threshold detector for detecting the presence of the sense input signal, a second threshold detector for detecting the presence of the feedback signal, and a mute control signal generator circuit for generating the mute control signal. Preferably, the comparison circuit provides a visual indication when the feedback signal is present when the sense input signal is not present. In particularly preferred embodiments, the comparison circuit generates and then removes the mute control signal in a periodic manner when the feedback signal is present when sense input signal is not present so as to provide an audible pumping of the audio output signal.

Another aspect of the present invention is a method of ensuring the protective operation of a speaker system protection circuit which monitors the magnitude of a speaker input signal via a sense line signal. The method operates to assure the protective operation even if the sense line signal does not reach the speaker system protection circuit. The method comprises the steps of sensing the presence of an audio driving signal transmitted to the speaker system, and sensing the presence of the sense line signal. The method further includes the steps of comparing the relative magnitudes of the audio driving signal and the sense line signal, and causing the magnitude of the audio driving signal to become attenuated when the audio driving signal is present but the sense line signal is not present. Preferably, the method further comprises the steps of buffering the sense line signal to provide a buffered sense signal for use by the speaker system protection circuit, and to provide a sense sample signal having a magnitude to be compared against the magnitude of the audio driving signal in the comparing step.

The method preferably includes the step of cycling the attenuation of the audio driving signal when the audio driving signal is present when the sense line signal is not present to provide an audible pumping of the audio output of the speaker being protected. Also preferably, the method includes the step of providing a visual indication when the audio driving signal is present when the sense line signal is not present.

These and other objects and features of the present invention will become more fully apparent from the following description and claims taken in conjunction with the accompanying drawings.

DETAILED DESCRIPTION OF THE PREFERRED EMBODIMENT

The invention is best understood by reference to the accompanying drawings wherein like parts are designated with like numerals throughout.

DESCRIPTION OF AN EXEMPLARY AUDIO SOUND SYSTEM

Figure 1:
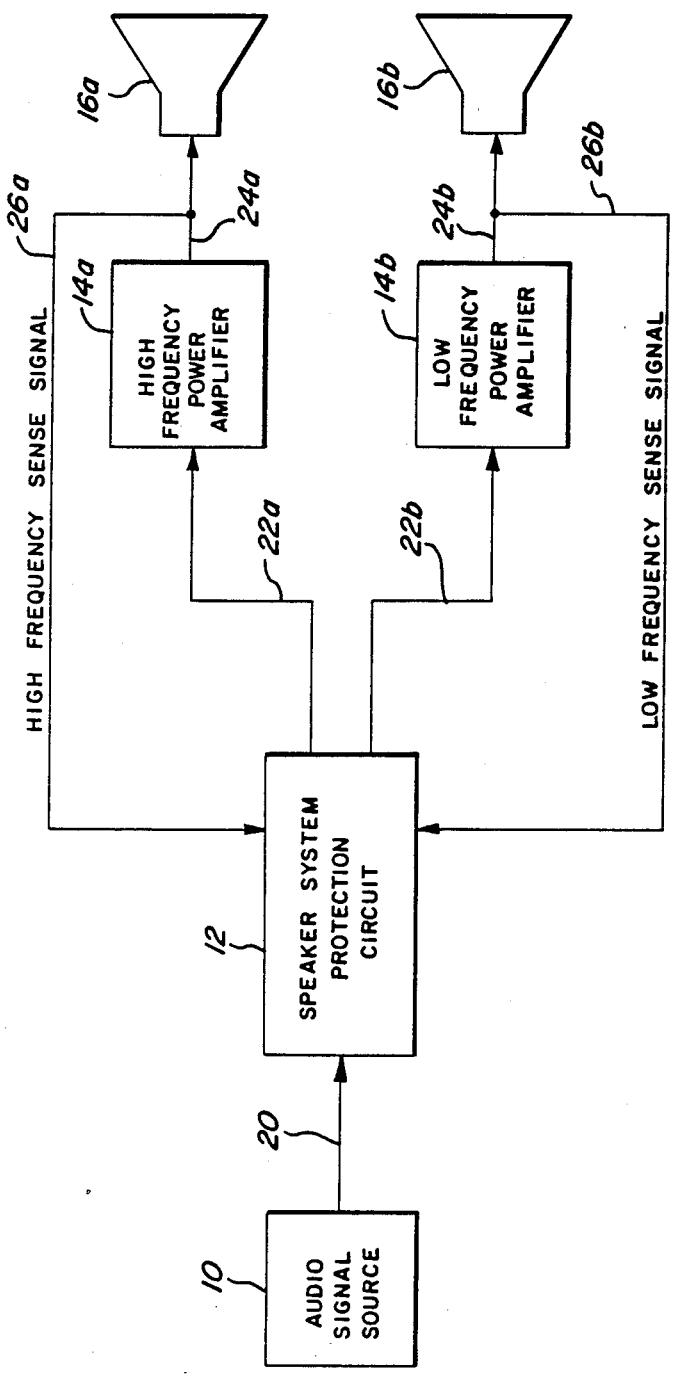
FIG. 1 is a block diagram of an exemplary audio sound system that includes a speaker system protection circuit and further includes sense lines to provide feedback from the outputs of the audio power amplifiers to the speaker system protection circuit.

FIG. 1 illustrates an exemplary high power audio sound system which may incorporate the sense line disconnect or failure detection circuitry of the present invention to be described hereinafter. The typical high power audio sound system of FIG. 1 comprises an audio signal source 10, a speaker system protection circuit 12, a high frequency audio power amplifier 14a, a low frequency audio power amplifier 14b, a high frequency speaker 16a and a low frequency speaker 16b. The audio signal source 10, which may be a turntable, a tape deck, an audio mixer system, or the like, produces an audio input signal on an input signal line 20 which is connected to the signal input of the speaker system protection circuit 12.

The speaker system protection circuit 12 splits the audio input signal on the input signal line 20 into its high frequency components and its low frequency components. The high frequency components form a high frequency audio output signal that is provided as an output on a high frequency audio output signal line 22a, and the low frequency components form a low frequency audio output signal on a low frequency audio output signal line 22b. The high frequency audio output signal on the signal line 22a drives the high frequency audio power amplifier 14a which produces a high power, high frequency audio signal on a signal line 24a which in turn drives the high frequency speaker 16a. In like manner, the low frequency audio output signal on the signal line 22b drives the low frequency audio power amplifier 14b which produces a high power, low frequency audio signal on a signal line 24b which in turn drives the low frequency speaker 16b. The speaker system protection circuit 12 is often referred to as an audio processing system or an audio processor.

As set forth in U.S. Pat. No. 4,583,245, which is incorporated herein by reference, the audio signal provided by the audio signal source 10 comprises components in more than one range of audio frequencies. Since typical speakers, such as the speakers 16a and 16b, do not efficiently respond to a wide range of audio frequencies, a speaker protection system, such as the speaker system protection circuit 12, includes a cross-over network comprising filters in which the audio signals in various frequency ranges are separated and directed to an appropriate output signal which in turn is used to drive a speaker, or speaker system, designed for a particular frequency range. As further set forth in U.S. Pat. No. 4,583,245, the audio signal provided by the audio signal source may be such that the components at one end of a given frequency range may comprise more power than can be safely handled by the speakers that are connected to receive those frequency components. In order to prevent damage to the speakers, the speaker system protection circuit 12 includes adjustable filters in the cross-over network which are adjusted so that a portion of the audio signal originally intended for one speaker is redirected to another speaker. For example, an audio signal component having a frequency at the low end of the frequency range for the high frequency speaker 16a is advantageously redirected to the low frequency speaker 16b where it becomes an audio signal component at the high end of the frequency range for the low frequency speaker 16b. Thus, rather than simply reducing the gain of the high frequency speaker and thus reducing the overall performance of the system, it can be seen that the cross-over frequency of the speaker protection network is changed so that the high power components at one end of the frequency range are switched from on speaker to another speaker so that the components continue to be converted to audio energy by a speaker and so that the overall gain of the system does not have to be reduced.

In order for the speaker system protection circuit 12 of FIG. 1 to operate properly, the speaker system protection circuit 12 must be provided with input signals that indicate the amount of power that is being applied to high frequency speaker 16a and the low frequency speaker 16b. The power applied to a speaker is determined by the audio signal input from the audio signal source 10. In addition, the power applied to a speaker is determined by the power amplification of its respective audio power amplifier (i.e., the high frequency power amplifier 14a for the high frequency speaker 16a, and the low frequency power amplifier 14b for the low frequency speaker 16b). Since the speaker system protection circuit 12 has no control over the amplification factors of the power amplifiers 14a and 14b, the speaker system protection circuit is provided with feedback from the outputs of the two power amplifiers. The feedback is provided by a high frequency sense signal from the output of the high frequency audio power amplifier 14a via a high frequency sense line 26a, and is provided by a low frequency sense signal from the output of the low frequency audio power amplifier 14b via a low frequency sense line 26b. These sense signals detect the levels of the signals that are driving the high frequency speaker 16a and the low frequency speaker 16b, respectively, and thus depend upon both the audio signal input from the audio signal source 10 and the amplification provided by the power amplifiers 14a and 14b. The sense signals thus provide a means by which the speaker system protection circuit 12 determines when the power applied to a speaker is approaching the safety limits for that speaker. The operation of the speaker system protection circuit 12 in response to power excursions close to the limit of a speaker is described in the above-referenced U.S. Pat. No. 4,583,245.

It can be seen that if the speaker system protection circuit 12 does not receive signals on the sense lines 26a and 26b, it will not detect the power excursions and will not protect the speaker. For example, if the high frequency sense line 26a is broken or otherwise not connected to the output of the high frequency power amplifier 14a, the excursion limit circuitry within the speaker system protection circuit 12 will not detect that the power output of the high frequency power amplifier 14a is approaching the power limit of the high frequency speaker 16a and will not switch the cross-over frequency or otherwise protect the high frequency speaker 16a. The speaker system protection circuit 12 will continue to provide the high power, high frequency audio signal on the signal line 22a although the safe operating limits of the high frequency speaker 16a have been reached or exceeded. The present invention provides a means for detecting that either the high frequency sense line 26a or the low frequency sense line 26b is broken or otherwise inoperable, and for preventing excessive power excursions when the inoperable sense line is detected.

DESCRIPTION OF AUDIO SOUND SYSTEM INCORPORATING PRESENT INVENTION

Figure 2:
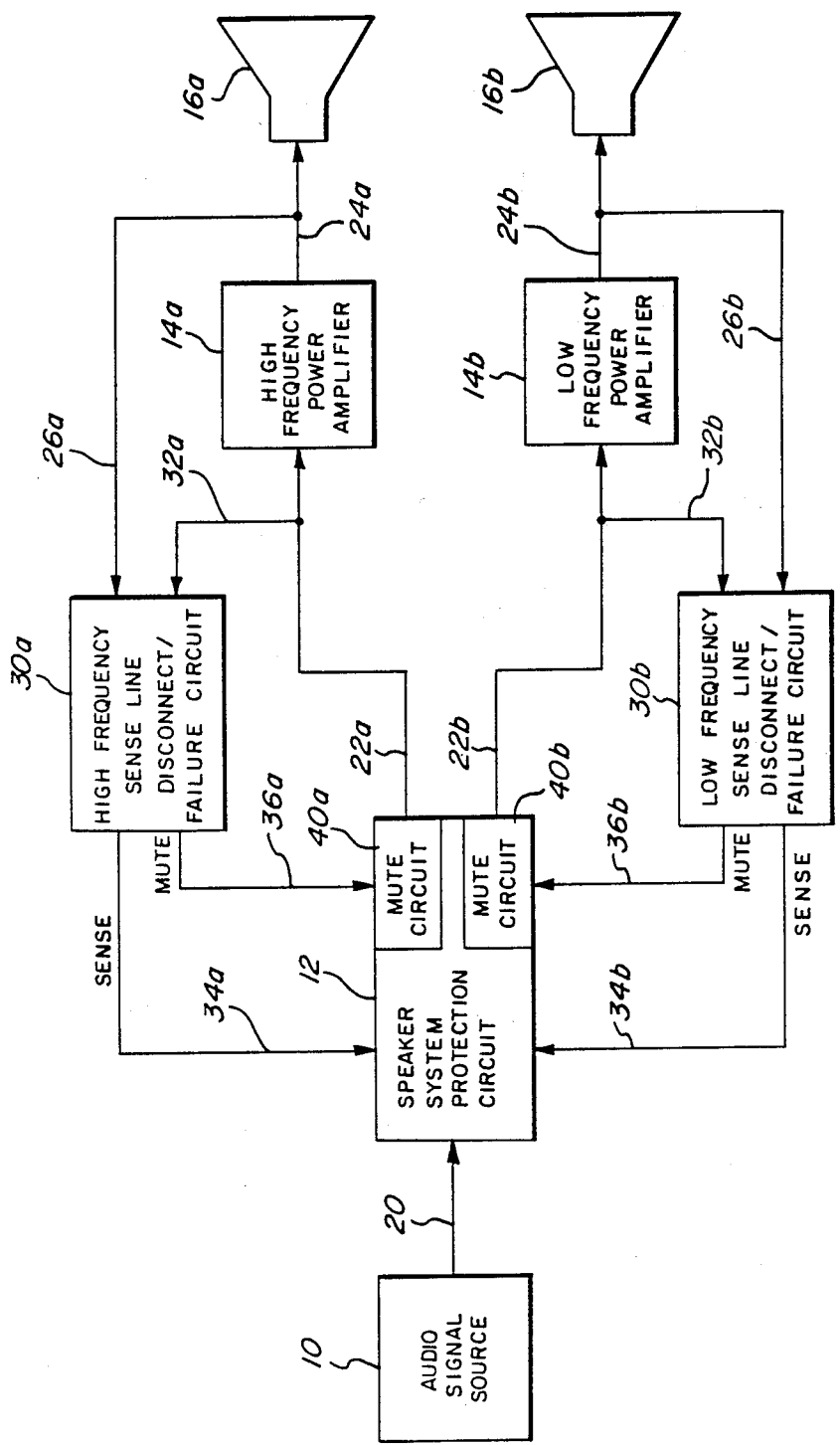
FIG. 2 is a block diagram illustrating the incorporation of the sense line disconnect or failure detection circuitry of the present invention with the audio sound system of FIG. 1.

FIG. 2 illustrates the audio sound system of FIG. 1 with the addition of the sense line failure detection circuitry of the present invention. In FIG. 2, the high frequency sense line 26a and the low frequency sense line 26b are not directly connected to the speaker system protection circuit 12. Rather, the high frequency sense line 26a is connected to a first input of a high frequency sense line disconnect/failure circuit 30a, and the low frequency sense line 26b is connected to a first input of a low frequency sense line disconnect/failure circuit 30b. The high frequency sense line disconnect/failure circuit 30a includes a second input which is connected to receive the high frequency audio signal output of the speaker system protection circuit 12 on the signal line 22a as feedback via a high frequency signal sample line 32a. The low frequency sense line disconnect/failure circuit 30b includes a second input which is connected to receive the low frequency audio signal output of the speaker system protection circuit 12 on the signal line 22b as feedback via a low frequency signal sample line 32b.

As will be described below, the high frequency sense line disconnect/failure circuit 30a buffers the high frequency sense signal on the high frequency sense line 26a and provides it to the speaker system protection circuit 12 as a buffered high frequency sense signal on a signal line 34a. Similarly, the low frequency sense line disconnect/failure circuit 30b buffers the low frequency sense signal on the low frequency sense line 26b and provides it to the speaker system protection circuit 12 as a buffered low frequency sense signal on a signal line 34b. In addition, the high frequency sense line disconnect/failure circuit 30a provides a high frequency mute control signal as an output on a signal line 36a, and the low frequency sense line disconnect/failure circuit 30b provides a low frequency mute control signal as an output on a signal line 36b. The high frequency mute control signal and the low frequency mute control signal are provided as inputs to the speaker system protection circuit 12 to indicate to the speaker system protection circuit 12 that the respective sense signal is not operating properly and to cause the speaker system protection circuit 12 to attenuate the respective audio signal output of the speaker system protection circuit 12.

The high frequency mute control signal and the low frequency mute control signal are shown connected to a high frequency mute circuit 40a and a low frequency mute circuit 40b, respectively, which are included as part of the speaker system protection circuit 12. The high frequency output of the speaker system protection circuit 12 passes through the high frequency mute circuit 40a, and the low frequency output of the speaker system protection circuit 12 passes through the low frequency mute circuit 40b. When the high frequency mute control signal is activated by the high frequency sense line disconnect/failure circuit 30a, the high frequency mute circuit 40a responds by attenuating the high frequency signal output on the signal line 22a and thus reducing the power level of the signal applied to the input of the high frequency power amplifier 14a. The low frequency mute circuit 40b operates in a similar manner in response to the activation of the low frequency mute control signal by the low frequency sense line disconnect/failure circuit 30b.

The operation of the high frequency sense line disconnect/failure circuit 30a and the low frequency sense line disconnect/failure circuit 30b to generate the respective mute control signals, and the operation of the high frequency and low frequency mute circuits 40a and 40b will be described more fully hereinafter. The operation of the high frequency sense line disconnect/failure circuit 30a is substantially the same as the operation of the low frequency sense line disconnect/failure circuit 30b. Similarly, the operation of the high frequency mute circuit 40a and the operation of the low frequency mute circuit 40b are substantially the same. Thus, although the following operational information will be described in terms of one of the circuits, it should be understood to apply to both circuits. As used hereinafter, the use of a numeric designator without an "a" or "b" appended thereto refers to an element that will be in either the corresponding high frequency circuit or the corresponding low frequency circuit.

BLOCK DIAGRAM OF HIGH FREQUENCY SENSE LINE DISCONNECT/FAILURE CIRCUIT

Figure 3:
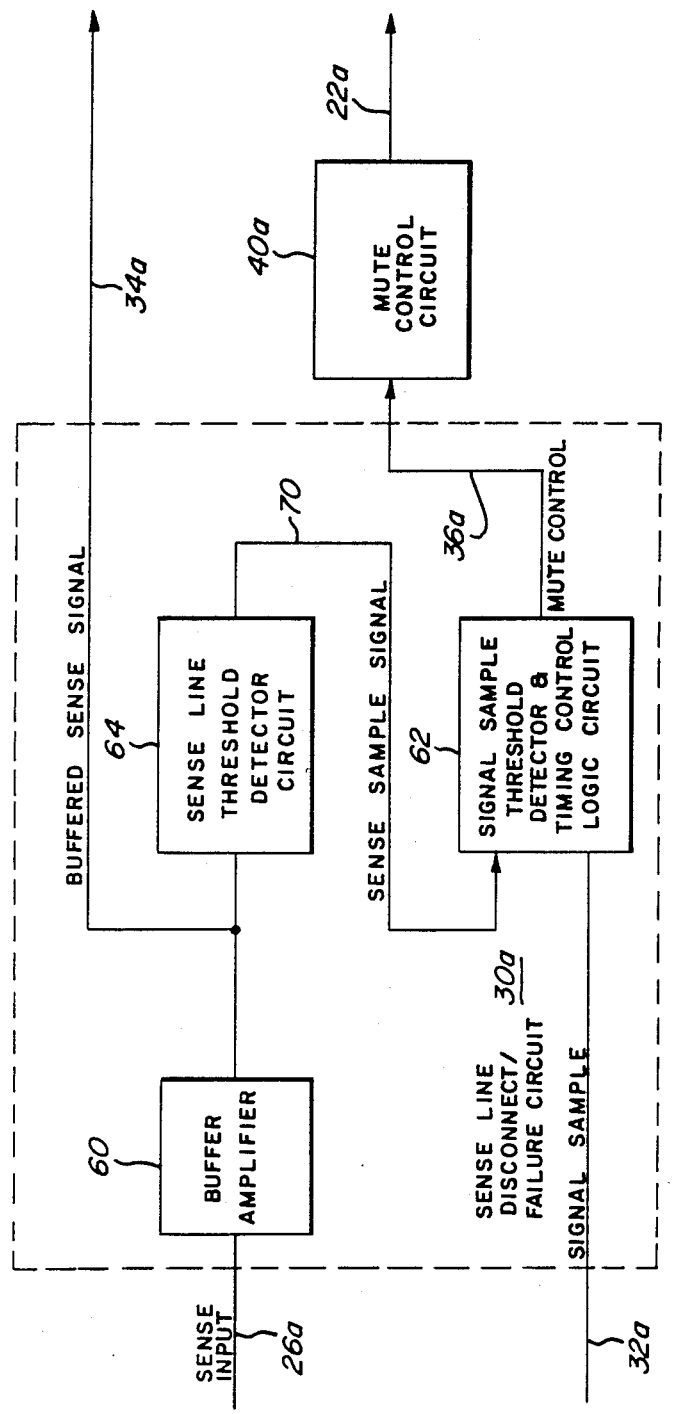
FIG. 3 is a block diagram illustrating additional details of a preferred embodiment of the high frequency sense line disconnect or failure detection circuitry of FIG. 2 in combination with the high frequency mute control circuit.

FIG. 3 is a block diagram of the high frequency sense line disconnect/failure circuit 30a and the high frequency mute circuit 40a. The high frequency sense line disconnect/failure circuit 30a operates by monitoring the high frequency sense signal on the signal line 26a and the high frequency audio signal output on the signal line 32a. The high frequency sense line disconnect/failure circuit 30a provides an active output signal to the mute control circuit 40a when it detects an active high frequency audio output signal on the signal line 32a without detecting a corresponding active high frequency sense signal on the high frequency sense line 26a.

As illustrated in FIG. 3, the high frequency sense line disconnect/failure circuit 30a comprises a buffer amplifier 60, a signal sample threshold detector and timing control logic circuit 62 and a sense line threshold detector 64. The output of the signal sample threshold detector and timing control logic circuit 62 is the high frequency mute control signal on the high frequency mute control line 36a. The buffer amplifier 60 has an input and an output. The input of the buffer amplifier 60 is connected to receive the high frequency sense signal on the high frequency sense line 26a. The buffer amplifier 60 provides the buffered high frequency sense signal as an output on the signal line 34a which is in turn provided as the high frequency sense input to the speaker system protection circuit 12. As will be discussed below when describing the detailed circuitry of the high frequency sense line disconnect/failure circuit 30a, the buffer amplifier 60 preferably includes a full-wave rectifier and amplifier that are connected in such that the buffered high frequency sense signal is always positive irrespective of the polarity of the output of the high frequency power amplifier 14a.

The buffered high frequency sense signal is also provided as an input to the sense line threshold detector circuit 64. The sense line threshold detector circuit 64 monitors the amplitude of the buffered high frequency sense signal. The sense line threshold detector circuit 64 provides an output signal on a line 70 which has a first signal level (e.g., a positive voltage) when the amplitude of the buffered high frequency sense signal is above a predetermined threshold amplitude level, and which has a second signal level (e.g., a negative voltage) when the buffered high frequency sense signal is below the predetermined threshold amplitude level. The buffer amplifier 60 and the sense line threshold detector circuit 64 operate together to provide a sense line sample signal that has a first magnitude when the high frequency sense signal is present and that has a second magnitude when the high frequency sense signal is not present.

The signal sample threshold detector and timing control logic circuit 62 has a pair of inputs and an output. A first input of the signal sample threshold detector and timing control circuit 62 is connected to receive the high frequency audio signal output of the speaker system protection circuit 12 on the signal line 22a via the high frequency signal sample line 32a. Thus, the signal sample threshold detector and timing control logic circuit 62 continuously monitors the high frequency audio signal output of the speaker system protection circuit 12. In the preferred embodiment of the present invention, the signal sample threshold detector and timing control logic circuit 62 includes a full-wave rectifier on its input such that the signal monitored by the signal sample and threshold detector 62 is always positive. A second input of the signal sample threshold detector and timing control logic circuit 62 is connected to receive the output of the sense line threshold detector circuit 64.

The signal sample threshold detector and timing control logic circuit 62 has a variable threshold which is determined by the output of the sense line threshold detector circuit 64. When the output of the sense line threshold detector circuit 64 has the first signal level (e.g., positive voltage level), the threshold of the signal sample threshold detector and timing control logic circuit 62 is selected such that it will not be exceeded by the high frequency audio output signal during the normal operation of the speaker system protection circuit 12. Thus, the output of the signal sample threshold detector and timing control logic circuit 62 will remain at an inactive (e.g., negative voltage) level. When the output of the sense line threshold detector circuit 64 is at the second signal level (e.g., negative voltage level), the threshold of the signal sample threshold detector and timing control logic circuit 62 is much lower. If the level of the high frequency audio signal output on the signal sample line 32a exceeds this lower threshold level while the second signal level remains at the second signal level, then the output of the signal sample threshold detector and timing control logic circuit 62 will change to its active (e.g., positive voltage) level to indicate that the high frequency sense line 26a is not communicating the increase in the high frequency audio output power back to the sense line threshold detector circuit 64 via the sense line buffer amplifier 60. Since this is a condition that may be indicative of a broken sense line, the signal sample threshold detector and timing control logic circuit 62 generates an active output signal on the high frequency mute control line 36a to activate the high frequency mute control circuit 40a and thus attenuate the high frequency audio output signal. Thus, it can be seen that the signal sample threshold detector and timing control logic circuit 62 effectively compares the magnitude of the audio output signal with the sense line sample signal from the sense line threshold detector circuit 64.

In the preferred embodiment described herein, the signal sample threshold detector and timing control logic circuit 62 activates the high frequency mute control circuit 40a on a periodic basis. This occurs because the attenuation of the high frequency audio output signal on the signal sample line 32a causes the magnitude of the signal applied to the first input of the signal sample threshold detector and timing control logic circuit 62 to be reduced below the threshold magnitude. By so reducing the signal magnitude, the output of the signal sample threshold detector and timing control logic circuit 62 changes from the active level to the inactive level and thus deactivates the high frequency mute control circuit 40a. In this preferred embodiment, timing components, to be described below, are provided to control the activation and deactivation of the high frequency mute control circuit 40a so that it occurs at a low frequency rate (e.g., approximately 1/6 Hz) that introduces an audible pumping of the program material that indicates to the listener that a problem exists. In addition, the preferred embodiment includes a light-emitting diode (LED) or other suitable display device to provide a visual indication of the lack of feedback on the high frequency sense line 26a.

In an alternative embodiment of the present invention in which the audible pumping of the output signal is undesirable, the signal sample threshold detector and timing control logic circuit 62 can be constructed to latch the active output signal on the high frequency mute control line so that the high frequency mute control circuit 40a is activated until reset. The reset can advantageously occur when the power to the system is turned off, or, in the alternative, can be caused to occur when the high frequency audio output signal on the signal sample line 32a remains at a very low magnitude for a predetermined amount of time.

DESCRIPTION OF THE DETAILED SCHEMATIC DIAGRAM

Figure 4:
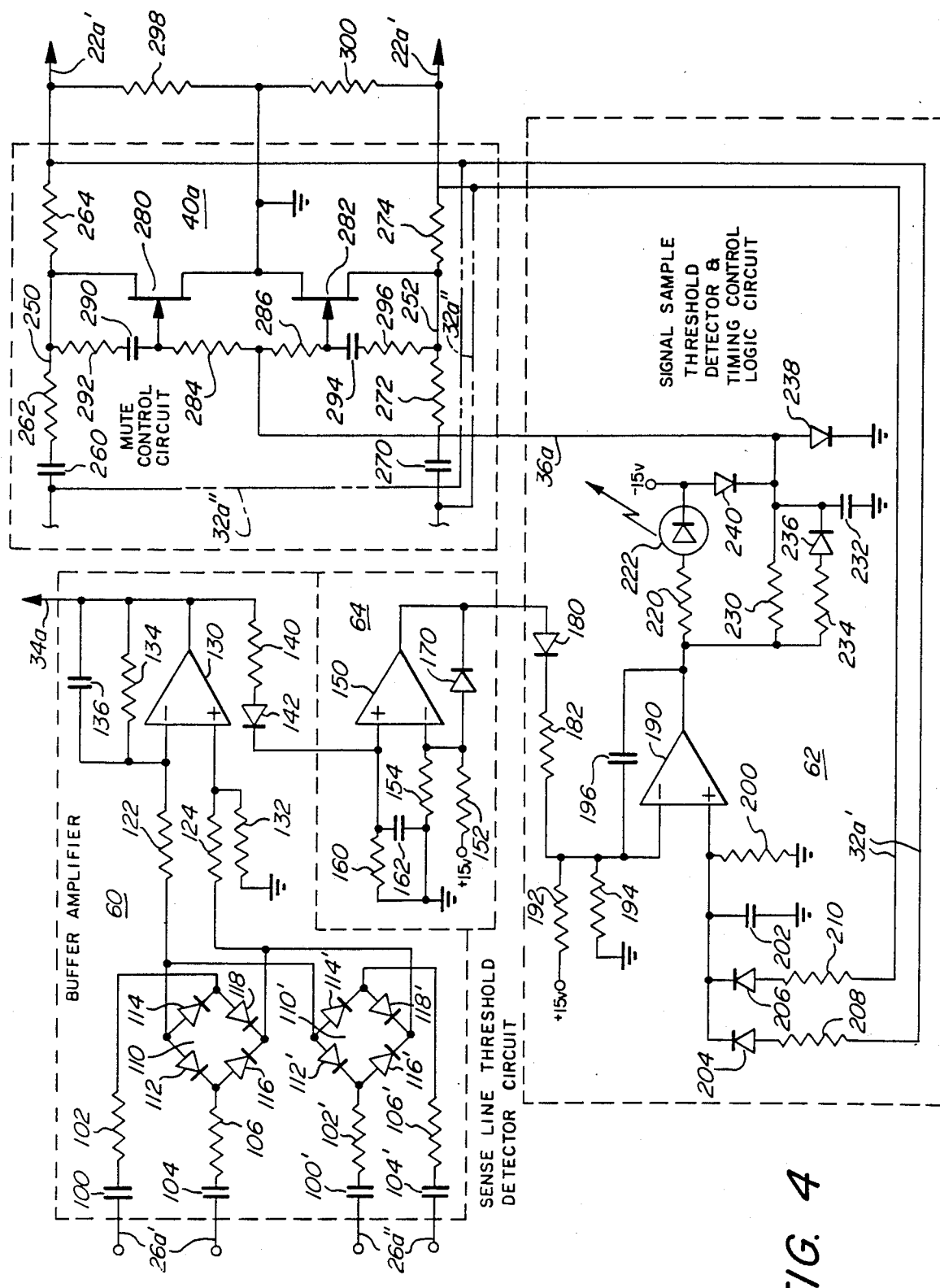
FIG. 4 is a schematic circuit diagram illustrating a preferred embodiment of the high frequency sense line disconnect or failure detection circuitry of the present invention and of the high frequency mute control circuit.

FIG. 4 schematically illustrates a preferred embodiment of a circuit in accordance with the block diagram of the high frequency sense line disconnect/failure circuit 30a of FIG. 3. The circuit in FIG. 4 comprises the buffer amplifier 60, the sense line threshold detector circuit 64, signal sample threshold detector and timing control logic circuit 62, and the high frequency mute control circuit 40a.

The buffer amplifier 60 comprises a first input coupling capacitor 100 connected in series with a first input resistor 102, and a second input coupling capacitor 104 connected in series with a second input resistor 106. The first and second input coupling capacitors 100 and 104 are connected to a pair of high frequency sense lines 26a', Although previously described in FIGS. 1, 2 and 3 as a single line, it should be understood that the high frequency sense line 26a comprises a air of lines 26a' which are connected to the output of the high frequency power amplifier 14a as illustrated in FIGS. 1 and 2. Since the output of the high frequency power amplifier 14a may have a different ground reference than the ground reference of the present circuit, the sense input signal on the sense input lines 26a', is capacitively coupled to the input of the buffer amplifier 60.

The first and second input resistors 102 and 106 are connected to the input of a full-wave bridge rectifier 110 comprising four diodes 112, 114, 116 and 118. The bridge rectifier 110 rectifies the AC input signal and provides an output signal having a positive voltage level proportional to the magnitude of the AC voltage input. A resistor 122 and a resistor 124 couple the outputs of the bridge rectifier 110 to the inverting input (−) and the non-inverting input (+), respectively, of a first operational amplifier 130. A resistor 132 is connected betWeen the non-inverting input of the first operational amplifier 130 and the ground reference. A feedback resistor 134 and a feedback capacitor 136 are connected in parallel between the output of the first operational amplifier 130 and the inverting input of the first operational amplifier 130. The resistors 122 and 124, the resistor 132 and the feedback resistor 134 have resistance values that are selected to reduce the relatively high DC output of the bridge rectifier 110 to a voltage level that is compatible with the relatively low operating voltage of the first operational amplifier 130. The output of the first operational amplifier 130 is connected to the buffered high frequency sense signal line 34a. Thus, the first operational amplifier 130 and the associated circuit components function to isolate the sense input signal on the lines 26a' and to provide the buffered high frequency sense output signal on the lines 34a', to the speaker system protection circuit 12 (FIG. 2).

In certain systems, an additional high frequency power amplifier (not shown) can be connected to the high frequency audio output of the speaker system protection circuit 12 to drive an additional high frequency speaker (not shown). To accommodate the additional power amplifier, an additional set of sense lines 26a'' are provided, along with an input circuit comprising a second bridge rectifier 110', (diodes 112', 114', 116' and 118') and associated input resistors 102', 106' and input coupling capacitors 100', 104'. The outputs of the second bridge rectifier 110' are electrically connected to the output of the bridge rectifier 110 so that when an active sense signal is provided to either set of input coupling capacitors from the respective power amplifier, the rectified sense signal is coupled to the input of the first operational amplifier 130. The first operational amplifier provides an active output signal when either set of sense lines is active. Thus, the failure of one set of sense lines does not disable the high frequency audio output of the speaker system protection circuit 12.

The output of the first operational amplifier 130 is also provided to the input of the sense line threshold detector circuit 64 via the series connection of a resistor 140 and a diode 142. The sense line threshold detector circuit 64 comprises a second operational amplifier 150 having an inverting input (−) and a non-inverting input (+). The cathode of the diode 142 is connected to the non-inverting input of the second operational amplifier 150. The inverting input of the second operational amplifier 150 is connected to a voltage divider comprising a first voltage divider resistor 152 and a second voltage divider resistor 154. The first and second voltage divider resistors 152 and 154 are connected between a positive voltage reference (e.g., +15 volts) and the ground reference so as to provide a small positive voltage bias on the inverting input of the second operational amplifier 150. This small positive voltage assures that the output of the operational amplifier will be slightly negative when no voltage is present on the sense line inputs 26a′.

The non-inverting input of the second operational amplifier 150 is connected to the parallel combination of a resistor 160 and a filter capacitor 162, which combination is in turn connected to the ground reference. The filter capacitor 162 operates as a filter and peak hold capacitor. The filter capacitor 162 is charged by the output of the first operational amplifier 130 in the buffer amplifier circuit 60 via the resistor 140 and the diode 142 and the charge time is thus controlled by the resistance of the resistor 140. The aforementioned connection of the diode 142 causes the capacitor 162 to charge in such a manner as to provide a positive voltage at the non-inverting input of the second operational amplifier 150. The capacitor 162 discharges through the parallel resistor 160 and the discharge time is thus controlled by the resistance of the parallel resistor 160 since the diode 142 blocks any discharge path through the resistor 140. The values of the resistor 140 and the resistor 160 are selected so that the capacitor 162 is charged relatively rapidly and discharged relatively slowly. For example, in the preferred embodiment, the resistor 160 has a magnitude that is approximately 150 times the magnitude of the resistor 140.

The sense line threshold detector circuit 64 further includes a diode 170 connected from the output of the second operational amplifier 150 to the inverting input. The anode of the diode 170 is connected to the inverting input and the cathode of the diode 170 is connected to the output of the second operational amplifier 150. It can be seen that when the output of the first operational amplifier 130 in the buffer amplifier circuit 60 charges the capacitor 162 to a voltage in excess of the threshold bias voltage at the inverting input of the second operational amplifier 150, the output of the second operational amplifier 150 will rapidly increase to a magnitude approximately equal to the supply voltage (e.g., +15 volts). The diode 170 is then reverse-biased and has little effect on the operation of the circuit. On the other hand, when the output of the first operational amplifier 130 in the buffer amplifier 60 begins to decrease, the capacitor 162 will discharge slowly, thus maintaining the differential voltage across the inverting and non-inverting inputs for a substantially longer time than that required to charge the capacitor. Thus, the output voltage of the second operational amplifier 150 will be maintained at its high level. This prevents the output of the second operational amplifier 150 from changing in response to transients in the sense voltage caused, for example, by pauses in the audio input signal on the input line 20 (FIG. 2). If the output of the first operational amplifier 130 in the buffer amplifier 60 remains low for a sufficient amount of time to allow the voltage across the capacitor 162 to discharge to approximately zero volts, which is below the positive bias voltage on the inverting input of the second operational amplifier 150, the output of the second operational amplifier 150 will attempt to switch from its positive voltage output to a negative voltage output. However, the diode 170 will then become forward-biased so that the output of the second operational amplifier 150 cannot go lower than one diode voltage drop below the very low positive bias voltage on the inverting input of the second operational amplifier 150.

It can be seen from the foregoing that the output of the second operational amplifier 150 will be a voltage approximately equal to the positive voltage reference when the signal on the pair of high frequency sense lines 26a′ is active and will be a voltage approximately equal to the ground reference when the signal on the pair of sense lines 26a′ has been inactive for a sufficient amount of time to discharge the capacitor 162. The output of the second operational amplifier 150 in the sense line threshold detector circuit 64 is provided as an input to the signal sample threshold detector and timing control logic circuit 62 via a diode 180 connected in series with a resistor 182. The anode of the diode 180 is connected to the output of the second operational amplifier 150 and the cathode is connected to the resistor 182. The signal sample threshold detector and timing control logic circuit 62 comprises a third operational amplifier 190 having an inverting input (−), a non-inverting input (+) and an output. A voltage divider network comprising a resistor 192 and a resistor 194 connected between the positive voltage reference (e.g., +15 volts) and the ground reference provides a small positive bias voltage to the inverting input of the third operational amplifier 190. A feedback capacitor 196 is connected from the output of the third operational amplifier 190 to the inverting input.

The non-inverting input of the third operational amplifier 190 is connected to a parallel combination of a bleeder resistor 200 and a timing capacitor 202, which parallel combination is connected to the ground reference. The non-inverting input of the third operational amplifier 190 is further connected to a full-wave rectifier comprising a diode 204 and a diode 206. The anode of the diode 204 and the anode of the diode 206 are connected via an input resistor 208 and an input resistor 210, respectively, to the high frequency audio output of the speaker system protection circuit 12 via a pair of signal lines 32a′. The pair of signal lines 32a′ correspond to the single signal line 32a in FIGS. 2 and 3, and it should be understood that the high frequency audio output signal is an AC-coupled signal. The diode 204 and the diode 206, with their cathodes connected to the non-inverting input of the third operational amplifier 190, provide full-wave rectification of the high frequency audio output signal and provide a positive rectified signal to the timing capacitor 202. The resistances of the input resistors 208 and 210 are selected to be substantially smaller than the resistance of the bleeder resistor 200 so that the timing capacitor 202 charges at a substantially faster rated through the input resistors 208 and 210 than it discharges through the bleeder resistor 200. For example, in the preferred embodiment of the present invention, the resistance of the bleeder resistor 200 is approximately 45 times the resistance of each of the input resistors 208 and 210.

The signal sample threshold detector and timing control logic circuit 62 further includes a resistor 220 connected in series with a light-emitting diode (LED) 222. The resistor 220 is connected between the output of the third operational amplifier 190 and the anode of the LED 222. The cathode of the LED 222 is connected to a negative voltage reference (e.g., −15 volts). When the output of the third operational amplifier 190 is sufficiently high relative to the negative voltage reference, current will flow through the LED 222 and cause it to emit light to indicate that the sense lines 26a' have failed.

The output of the third operational amplifier 190 is connected to a first output timing resistor 230. The first output timing resistor 230 is connected in series with an output timing capacitor 232 which is connected to the ground reference. A series combination of a second output timing resistor 234 and a diode 236 is connected in parallel with the first output timing resistor 230 with the cathode of the diode 236 connected to the output timing capacitor 232. A diode 238 is connected across the output timing capacitor 232 with the cathode of the diode 238 connected to the ground reference. Thus, it can be seen that the diode 238 prevents the capacitor 232 from charging to a significant positive voltage with respect to the ground reference. The voltage level on the common connection of the anode of the clamping diode 238, the output timing capacitor 232, the first output timing resistor 230 and the cathode of the diode 236 is the high frequency mute control signal that is provided as an output from the signal sample threshold detector and timing control logic circuit 62 on the signal line 36a.

The signal sample threshold detector and timing control logic circuit 62 further includes a clamping diode 240 that has its anode connected to the negative voltage supply and that has its cathode connected to the signal line 36a and thus to the output timing capacitor 232. When the power to the audio system is shut off, the voltage from the negative voltage supply will become approximately equal to the ground reference voltage. When this occurs, the output timing capacitor 232 will discharge through the clamping diode 240.

The resistance of the first output timing resistor 230 is selected to be substantially larger than the resistance of the second output timing resistor 234 so that when the output of the third operational amplifier 190 is negative with respect to the ground reference, the output timing capacitor 232 is charged via the first output timing resistor 230 to a negative voltage (with respect to the ground reference) at a relatively slow rate, and when the output of the third operational amplifier 190 is positive with respect to the ground reference, the output timing capacitor 232 is discharged to approximately zero volts at a relatively fast rate through the second output timing resistor 234 and the diode 236. For example, in the preferred embodiment, the resistance of the first output timing resistor 230 is selected to be approximately 100 times the resistance of the second output timing resistor 234.

When the signal sample signal on the pair of signal lines 32a' is active, the timing capacitor 202 will charge relatively rapidly through the resistor 208, the resistor 210, the diode 204 and the diode 206. As the timing capacitor 202 charges, the positive voltage level on the non-inverting input of the third operational amplifier 190 increases. When the voltage level on the non-inverting input exceeds the voltage level on the inverting input of the third operational amplifier 190, the output of the third operational amplifier 190 will change from a negative voltage level to a positive voltage level. If the output of the sense line threshold detector circuit 64 (i.e., the output of the second operational amplifier 150) is low indicating that the signal on the pair of sense lines 26a' is inactive, the output of the third operational amplifier 190 will switch when the voltage level on the non-inverting input reaches the small positive bias level set by the voltage divider network (resistors 192 and 194). However, when the signal on the pair of sense lines 26a' is active, the high level voltage output of the second operational amplifier 150 is provided through the diode 180 and the resistor 182 to the inverting input of the third operational amplifier 190. The resistance of the resistor 182 is selected to be substantially smaller than the resistance of the resistor 192 in the voltage divider network so that the bias provided by the voltage divider network is changed from a relatively small positive voltage to a relatively large positive voltage (e.g., a voltage approximately equal to one-half the positive voltage reference). This bias voltage is larger than the maximum voltage to which the timing capacitor 202 will be charged by the full-wave rectifier (diodes 204 and 206), and the output of the third operational amplifier 190 will remain at a negative voltage level so long as the high frequency sense signal on the pair of sense lines 26a' is active.

Since the high frequency signal sample signal on the pair of lines 32a' and the high frequency sense signal on the pair of lines 26a' will both begin increasing at the same time when an output signal is first provided by the speaker system protection circuit 12, the high gain of the second operational amplifier 150 assures that the voltage level output of the second operational amplifier 150 will increase much more rapidly than the voltage on the timing capacitor 202. This rapid increase in the output voltage of the second operational amplifier 150 assures that the voltage on the inverting input of the third operational amplifier 190 will increase to its maximum level long before the voltage on the timing capacitor 202 reaches the original low threshold voltage. Thus, no false indications of a broken sense line occur.

During normal operation of the signal sample threshold detector and timing control logic circuit 62, the output of the third operational amplifier 190 remains at the negative voltage level, as discussed above. The output timing capacitor 232 is charged to a negative voltage with respect to the ground reference by the first output timing resistor 230, and the output of the signal sample threshold detector and timing control logic circuit 62 thus has a negative voltage level. This negative voltage output of the signal sample threshold detector and timing control logic circuit 62 is provided to the input of the high frequency mute control circuit 40a which will be described in more detail hereinafter. When the negative voltage is applied to the high frequency mute control circuit 40a, no muting action occurs and the high frequency audio output signal on a pair of lines 22a' will be provided in a normal, unmuted condition. (The pair of lines 22a' correspond to the single line 22a in FIGS. 1, 2 and 3.)

In the event of a failure of the pair of sense lines 26a', the voltage on the inverting input of the third operational amplifier 190 will exceed the bias voltage on the non-inverting input, and the output of the third operational amplifier 190 will change from the negative voltage level to the positive voltage. The positive voltage is applied through the second output timing resistor 234 and the now forward-biased diode 236 to discharge the output timing capacitor 232 from the negative voltage to a voltage approximately equal to zero volts. Although the output of the third operational amplifier 190 is a positive voltage level, the clamping diode 238 prevents the output timing capacitor 232 from being charged to a significant positive voltage. Thus, when the sense signal on the pair of sense lines 26a' is inactive, the output of the signal sample threshold detector and timing control logic circuit 62 has a voltage level approximately equal to the ground reference. As will be discussed below, in the preferred embodiment of the high frequency mute control circuit 40a, this voltage level activates the high frequency mute control circuit 40a and causes the high frequency audio output signal to be attenuated, thus protecting the high frequency speaker 16a.

As set forth above, the resistance of the second output timing resistor 234 is selected to be substantially smaller than the resistance of the first output timing resistor 230 so that the output timing capacitor 232 is discharged very rapidly compared to the charging of the output timing capacitor 232. Thus, in the event of a sudden failure of the pair of sense lines 26a', the output of the signal sample threshold detector and timing control logic circuit 62 is quickly changed to the ground reference voltage level to protect the high frequency speaker 16a. In the preferred embodiment illustrated herein, no latching action is provided in the signal sample threshold detector and timing control logic circuit 62 so that when the high frequency audio output signal is muted, the signal sample provided to the input of the signal sample threshold detector and timing control logic circuit 62 on the pair of signal sample lines 32a' returns to an inactive voltage level. This allows the timing capacitor 202 to slowly discharge through the bleeder resistor 200. When the timing capacitor 202 discharges below the bias level provided by the voltage divider network (the resistors 192 and 194), the output of the third operational amplifier 190 switches to its negative voltage level and slowly charges the output timing capacitor 232 through the resistor 230. When the voltage across the output timing capacitor 232 and thus the output of the signal sample threshold detector and timing control logic circuit 62 becomes sufficiently negative, the high frequency mute control circuit 40a is deactivated to remove the attenuation from the high frequency audio output signal. The timing capacitor 202 will once again begin charging. If the pair of sense lines continues to be inoperable, then the output of the third operational amplifier 190 will switch voltage levels when the voltage on the timing capacitor 202 reaches the bias voltage and the clamping action will occur again, as described above. This periodic clamping and unclamping will continue until the problem with the pair of sense lines 26a' is corrected. It can be seen that the periodic clamping and unclamping will introduce an audible pumping sound into the music or other sound being generated to alert the user of the equipment that a sense line failure has occurred. The equipment in which the failure has occurred can be identified by observing the light emitted from the LED 222 associated with the equipment. In the preferred embodiment, the values of the timing components are selected so that the periodic pumping occurs at a rate of approximately 1/6 Hz and the duty cycle of the pumping is selected so that the high frequency speaker 16a is activated for a very short time during each cycle so as to prevent harm to the speaker.

An exemplary high frequency mute control circuit 40a is also illustrated in FIG. 4. As illustrated, the high frequency audio output of the speaker system protection circuit 12 is provided on a pair of lines 250 and 252 that are connected to the pair of high frequency audio output lines 22a'. Only the portion of the audio output circuitry related to the high frequency mute control circuit 40a is shown in FIG. 4. The audio output on the line 250 is AC-coupled by a coupling capacitor 260 in series with a resistor 262 and a resistor 264. The two resistors 262 and 264 have relatively low resistance values (e.g., 100 ohms). In like manner, the audio output on the line 252 is AC-coupled by a coupling capacitor 270 in series with a resistor 272 and a resistor 274.

The high frequency mute control circuit 40a comprises a first field effect transistor (FET) 280 and a second FET 282. One terminal (e.g., the drain) of the first FET 280 is connected between the resistor 262 and the resistor 264 in the line 250. The other terminal (e.g., the source) of the first FET 280 is connected to the ground reference. In like manner, one terminal of the second FET 282 is connected between the resistor 272 and the resistor 274 in the line 252. The other terminal of the second FET 282 is connected to the ground reference. The gates of the first FET 280 and the second FET 282 are connected to the output of the signal sample threshold detector and timing control logic circuit 62 via a first mute circuit resistor 284 and a second mute circuit resistor 286. When the output of the signal sample threshold detector and timing control logic circuit 62 on the high frequency mute control line 36a is inactive (i.e., has a negative voltage on it caused by the charging of the output timing capacitor 232), the voltages applied to the gates of the first and second FET's 280 and 282 are negative with respect to the ground reference voltage on the source terminals of the two FET's. The two FET's 280 and 282 are selected so that when the voltages on the gates are negative, the FET's are non-conducting between the sources and the drains. Thus, the FET's 280 and 282 are effectively open circuits and have no effect on the high frequency audio output signals provided on the pair of lines 22a'. When the output of the signal sample threshold detector and timing control logic circuit 62 on the line 36a switches to a voltage approximately equal to the voltage of the ground reference, as described above, the two FET's 280 and 282 begin to conduct and act as very low resistance paths from the signal lines 250 and 252 to the ground reference. This has the effect of attenuating the high frequency audio output signal on the pair of signal lines 22a'. Since the signal lines 250 and 252 are AC-coupled to the output circuitry (not shown) in the speaker system protection circuit 12 via the coupling capacitors 260 and 270 and the resistors 262 and 272, the operation of the two FET's 280 and 282 does not present an excessive load to that output circuitry.

It can be seen that when the two FET's 280 and 282 are activated to clamp the high frequency audio output lines 22a', the signal sample signal on the pair of lines 32a' is likewise clamped (FIG. 2). Thus, the periodic pumping of the high frequency audio output signal will occur, as previously described. When the high frequency mute control signal on the line 36a switches from the ground reference voltage to the negative polarity voltage, the rate at which the voltage on the gates of the two FET's 280 and 282 may vary in accordance with the gate characteristics of the two FET's thus introducing a variation in the turn-on characteristics of the two FET's. In order to reduce this variation a capacitor 290 and a series resistor 292 are connected between the gate and the drain of the first FET 280. In like manner a capacitor 294 and a series resistor 296 are connected between the gate and the drain of the second FET 282.

A bleeder resistor 298 and a bleeder resistor 300 are connected between the pair of high frequency audio output lines 22a' and the ground reference to terminate the output lines 22a' when the muting action occurs.

As set forth above, the signal sample threshold detector and timing control logic circuit 62 and the high frequency mute control circuit 40a are interconnected so that the high frequency audio output is periodically muted, thus causing an audible pumping sound in the output signal. If the audible pumping of the audio output signal is not desired, the pair of signal sample lines 32a' can be connected in an alternative configuration directly to the output of the speaker system protection circuit 12 prior to the AC-coupling capacitors 260 and 270. This connection is represented by a pair of phantom lines 32a'. Since the clamping action of the first and second FET's 280 and 282 has no effect on the output of the speaker system protection circuit 12 prior to the AC-coupling capacitors 260 and 270, the clamping action will not be fed back to the signal sample threshold detector and timing control logic circuit 62, as described above, and the output of the signal sample threshold detector and timing control logic circuit 62 on the line 36a will remain at the ground reference level until reset. The reset can occur by removing the high frequency signal source for a sufficiently long time so that the bleeder resistor 200 can fully discharge the timing capacitor 202. Alternatively, the power can be removed from the circuit so that the output timing capacitor 232 is discharged. This discharge is facilitated by the clamping diode 240, as discussed above.

Although described above in terms of the high frequency circuits, it should be understood that the foregoing description also applies to the low frequency circuits. The low frequency sense line failure detection system operates independently of the high frequency sense line failure detection system so that failure of the sense line connected to the output of the high frequency amplifier does not affect the output of the low frequency components of the speaker system protection circuit 12, and vice versa.

It should be further understood that although the invention has been described above in connection with a two-way cross-over network having a high frequency and a low frequency portion, the invention can also be used in a system that divides the input audio signal into additional frequency components. For example, the invention can be advantageously used in connection with a three-way cross-over system having low-frequency circuits, mid-frequency circuits and high frequency circuits. The portion of the speaker system protection circuit associated with each frequency range is provided with a sense line disconnect/failure circuit as described above.

This invention may be embodied in other specific forms without departing from the essential characteristics as described herein. The embodiments described above are to be considered in all respects as illustrative only and not restrictive in any manner. The scope of the invention is indicated by the following claims, rather than by the foregoing description. Any and all changes which come within the meaning and range of equivalency of the claims are to be considered within their scope.

What is claimed is:

1. A protection circuit for an audio power system which includes an audio processor circuit that provides a first audio output signal to an audio power amplifier, said audio power amplifier providing an amplified audio output signal to a speaker, said audio processor circuit including a sense input for receiving a sense input signal proportional to the magnitude of the amplified audio output signal from said audio power amplifier, said processor circuit responsive to the magnitude of said sense signal to selectively reduce the magnitude of said first audio output signal, said protection circuit comprising:
   a first input for receiving said sense input signal;
   a second input for receiving a signal proportional to said first audio output signal from said processor circuit;
   means for comparing said sense input signal with said first audio output signal and for generating a control signal when said sense input signal fails to change when said first audio output signal changes; and
   a mute circuit connected to the output of said processor circuit, said mute circuit responsive to said control signal to attenuate said first audio output signal when said sense signal fails to change when said audio output signal changes.

2. A detection circuit for a speaker system protection circuit which accepts an audio input signal and provides a first audio output signal to an audio power amplifier, said audio power amplifier providing an amplified audio output signal to a speaker, said speaker system protection circuit having a sense input for receiving a sense input signal proportional to the magnitude of said amplified audio output signal from said audio power amplifier, said speaker system protection circuit responsive to the magnitude of said sense signal by selectively attenuating said first audio output signal, said detection circuit comprising:
   a first input for receiving said sense input signal;
   a second input for receiving a feedback signal proportional to said first audio output signal from said speaker system protection circuit;
   a comparison circuit which compares the relative magnitudes of said sense input signal and said feedback signal, said comparison circuit generating a mute control signal when said sense input signal is not present when said feedback signal is present; and
   a mute circuit connected to the output of said speaker system protection circuit, said mute circuit responsive to said mute control signal by attenuating said first audio output signal when said sense input signal is not present when said feedback signal is present.

3. A detection circuit as defined in claim 2, further comprising a buffer circuit connected to said first input of said detection circuit, said buffer circuit providing a buffered sense signal to said speaker system protection circuit, said buffered sense signal proportional to said sense input signal, said buffer circuit further providing a sense sample signal to said comparison circuit.

4. A detection circuit as defined in claim 2, wherein said comparison circuit comprises:
   a first threshold detector for detecting the presence of said sense input signal;
   a second threshold detector for detecting the presence of said feedback signal; and a mute control signal generator circuit for generating said mute control signal.

5. A detection circuit as defined in claim 2, wherein said comparison circuit provides a visual indication when said feedback signal is present when said sense input signal is not present.

6. A detection circuit as defined in claim 2, wherein said comparison circuit generates and then removes said mute control signal in a periodic manner when said feedback signal is present when said sense input signal is not present.

7. A method of ensuring the protective operation of a speaker system protection circuit connected to a speaker system, said speaker system protection circuit monitoring the magnitude of an audio frequency speaker input signal via an audio frequency sense line signal, said method ensuring the protective operation said protection circuit even if said sense line signal does not reach said speaker system protection circuit, said method comprising the steps of:
sensing the magnitude of an audio frequency driving signal transmitted to said speaker system;
sensing the magnitude of said audio frequency sense line signal;
comparing the relative magnitude of said audio frequency driving signal and said audio frequency sense line signal; and
causing the magnitude of said audio frequency driving signal to become attenuated when said audio frequency driving signal is present when said audio frequency sense line signal is not present.

8. A method of ensuring the protective operation of a speaker system protection circuit as defined in claim 7, further comprising the steps of buffering said audio frequency sense line signal to provide a buffered sense signal for use by said speaker system protection circuit and to provide a sense sample signal having a magnitude compared against the magnitude of said audio frequency driving signal in said comparing step.

9. A method of ensuring the protective operation of a speaker system protection circuit connected to a speaker system which monitors the magnitude of a speaker input signal via a sense line signal, even if said sense line signal does not reach said speaker system protection circuit, said method comprising the steps of:
sensing the presence of an audio driving signal transmitted to said speaker system;
sensing the presence of said sense line signal;
comparing the relative magnitudes of said audio driving signal and said sense line signal;
causing the magnitude of said audio driving signal to become attenuated when said audio driving signal is present when said sense line signal is not present; and
cycling said attenuation of said audio driving signal when said audio driving signal is present when said sense line signal is not present.

10. A method of ensuring the protective operation of a speaker system protection circuit as defined in claim 7, further comprising the step of providing a visual indication when said audio frequency driving signal is present when said audio frequency sense line signal is not present.

* * * * *